(12) United States Patent
Kim et al.

(10) Patent No.: US 10,847,597 B2
(45) Date of Patent: Nov. 24, 2020

(54) DISPLAY DEVICE

(71) Applicant: Samsung Display Co., LTD., Yongin-si (KR)

(72) Inventors: Kiwook Kim, Hwaseong-si (KR); Kwang-Min Kim, Seoul (KR); Joong-Soo Moon, Hwaseong-si (KR); Changkyu Jin, Anyang-si (KR)

(73) Assignee: Samsung Display Co., Ltd., Yongin-si (KR)

(*) Notice: Subject to any disclaimer, the term of this patent is extended or adjusted under 35 U.S.C. 154(b) by 78 days.

(21) Appl. No.: 16/052,611

(22) Filed: Aug. 2, 2018

(65) Prior Publication Data
US 2019/0206966 A1 Jul. 4, 2019

(30) Foreign Application Priority Data

Jan. 2, 2018 (KR) .................. 10-2018-0000374

(51) Int. Cl.
*H01L 27/32* (2006.01)
*G09G 3/3233* (2016.01)
(Continued)

(52) U.S. Cl.
CPC ......... *H01L 27/3276* (2013.01); *G09G 3/325* (2013.01); *G09G 3/3233* (2013.01); *H01L 27/3258* (2013.01); *H01L 27/3262* (2013.01); *H01L 27/3265* (2013.01); *H01L 27/3272* (2013.01); *G09G 3/3266* (2013.01);
(Continued)

(58) Field of Classification Search
CPC ............. H01L 27/3276; H01L 27/3279; H01L 27/124; H01L 27/3272; H01L 27/1248; H01L 27/3258; H01L 27/1244; H01L 27/3288; H01L 27/329; H01L 27/3297; G03G 2300/0426; G03G 2320/0209; G03G 3/3233–325; G03G 2310/0262; G03G 2310/0297; G09G 2300/0426; G09G 2320/0209; G09G 2320/0214; G02F 2001/136218; G02F 2001/13629; G02F 2001/136295; G02F 2001/133357;
(Continued)

(56) References Cited

U.S. PATENT DOCUMENTS 7,626,670 B2 12/2009 Park
8,730,132 B2 5/2014 Choi et al.
(Continued)

FOREIGN PATENT DOCUMENTS

KR 10-1100883 1/2012
KR 10-2014-0127047 11/2014
(Continued)

*Primary Examiner* — Yu Chen
(74) *Attorney, Agent, or Firm* — H.C. Park & Associates, PLC (57) ABSTRACT

A display device including a first data line and a second data line extending along a first direction, a first transistor connected to the first data line, a second transistor connected to the first transistor, a third transistor electrically connected to the second transistor, a connecting line disposed between the first data line and the second data line, the connecting line connecting the second transistor to the third transistor, and a driving voltage line disposed on the connecting line, the driving voltage line extending between the first data line and the connecting line.

18 Claims, 8 Drawing Sheets

(51) Int. Cl.
*G09G 3/325* (2016.01)
*G09G 3/3275* (2016.01)
*G09G 3/3266* (2016.01)
*G09G 3/3291* (2016.01)

(52) U.S. Cl.
CPC ......... *G09G 3/3275* (2013.01); *G09G 3/3291* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2310/0297* (2013.01); *G09G 2320/0209* (2013.01); *H01L 27/3218* (2013.01)

(58) Field of Classification Search
CPC ..... G02F 2001/13456; G02F 1/136286; G02F 1/133345; G02F 1/1345–13458
See application file for complete search history.

(56) References Cited

U.S. PATENT DOCUMENTS

| | | | |
|---|---|---|---|
| 9,721,499 B2 | 8/2017 | Kwon et al. | |
| 2007/0057877 A1* | 3/2007 | Choi | G09G 3/3291 |
| | | | 345/76 |
| 2016/0211273 A1* | 7/2016 | Moon | H01L 27/1255 |
| 2016/0217744 A1 | 7/2016 | Song et al. | |
| 2016/0322450 A1* | 11/2016 | Lee | H01L 27/10882 |
| 2017/0140706 A1 | 5/2017 | Song et al. | |
| 2018/0138259 A1* | 5/2018 | Kim | H01L 27/3276 |
| 2018/0247988 A1* | 8/2018 | Lee | H01L 27/3248 |
| 2018/0331124 A1* | 11/2018 | Cho | H01L 27/156 |

FOREIGN PATENT DOCUMENTS

| | | |
|---|---|---|
| KR | 10-2016-0092530 | 8/2016 |
| KR | 10-2017-0058492 | 5/2017 |

\* cited by examiner

DISPLAY DEVICE

CROSS REFERENCE TO RELATED APPLICATION

This application claims priority from and the benefit of Korean Patent Application No. 10-2018-0000374, filed on Jan. 2, 2018, which is hereby incorporated by reference for all purposes as if fully set forth herein.

BACKGROUND

Field

Exemplary embodiments of the invention relate generally to a display device, and, more specifically, to an organic light emitting display device including a plurality of pixels.

Discussion of the Background

An organic light emitting display device may have an organic light emitting element including a hole injection layer, an electron injection layer, and an organic light emitting layer formed therebetween. In the organic light emitting display device, light may be generated as excitons, which are the combination of holes injected from the hole injection layer and electrons injected from the electron injection layer, fall from an excited state to a ground state. The organic light emitting display device may not include a separate light source to generate light, and thus the organic light emitting display device may have a relatively small thickness and light weight as well as relatively low power consumption. Furthermore, the organic light emitting display device may have relatively wide viewing angle, high contrast, and high response speed, etc.

The number of signal lines may increase as the resolution of the display device increases, and a space between the signal lines may be narrower as the number of the signal lines increases. In this case, crosstalk may occur between the signal lines.

The above information disclosed in this Background section is only for understanding of the background of the inventive concepts, and, therefore, it may contain information that does not constitute prior art.

SUMMARY

Exemplary embodiments of the invention provide a display device in which crosstalk between signal lines is minimized.

Additional features of the inventive concepts will be set forth in the description which follows, and in part will be apparent from the description, or may be learned by practice of the inventive concepts.

An exemplary embodiment of the invention provides a display device including a first data line and a second data line extending along a first direction, a first transistor connected to the first data line, a second transistor connected to the first transistor, a third transistor electrically connected to the second transistor, a connecting line disposed between the first data line and the second data line, the connecting line connecting the second transistor to the third transistor, and a driving voltage line disposed on the connecting line, the driving voltage line extending between the first data line and the connecting line.

The display device may further include an insulation layer disposed between the connecting line and the driving voltage line, a trench being defined in the insulation layer between the first data line and the connecting line. The driving voltage line may extend into the trench.

The trench may have a polygonal shape in a plan view.

The driving voltage line may extend between the second data line and the connecting line.

The display device may further include an insulation layer disposed between the connecting line and the driving voltage line, a first trench being defined in the insulation layer between the first data line and the connecting line, a second trench being defined in the insulation layer between the second data line and the connecting line. The driving voltage line may extend into the first trench and into the second trench.

The first data line, the second data line, and the connecting line may be disposed at substantially the same layer.

The connecting line may connect a gate electrode of the second transistor to a source/drain region of the third transistor.

The connecting line may extend along the first direction.

The display device may further include an organic light emitting element electrically connected to the second transistor.

The display device may further include a capacitor including a first electrode and a second electrode. The first electrode of the capacitor may be connected to the connecting line. The second electrode of the capacitor may be connected to the driving voltage line.

The third transistor may electrically connect a gate electrode to a source/drain region of the second transistor.

The display device may further include an initialization voltage line extending along a second direction crossing the first direction. The third transistor may be connected to the initialization voltage line.

Another exemplary embodiment of the invention provides a display device including a first pixel including a plurality of transistors, a second pixel located in a first direction from the first pixel, a first data line extending along the first direction and connected to the first pixel, a second data line extending along the first direction and connected to the second pixel, a connecting line disposed between the first data line and the second data line, the connecting line connecting two transistors among the plurality of transistors, and a driving voltage line disposed on the connecting line, the driving voltage line extending between the first data line and the connecting line.

The display device may further include an insulation layer disposed between the connecting line and the driving voltage line, a trench being defined in the insulation layer between the first data line and the connecting line. The driving voltage line may extend into the trench.

The trench may have a polygonal shape in a plan view.

The driving voltage line may extend between the second data line and the connecting line.

The display device may further include an insulation layer disposed between the connecting line and the driving voltage line, a first trench being defined in the insulation layer between the first data line and the connecting line, a second trench being defined in the insulation layer between the second data line and the connecting line. The driving voltage line may extend into the first trench and into the second trench.

The first data line, the second data line, and the connecting line may be disposed at substantially the same layer.

The plurality of transistors may include a first transistor connected to the first data line, a second transistor connected to the first transistor, and a third transistor electrically connected to the second transistor. The connecting line may connect a gate electrode of the second transistor to a source/drain region of the third transistor.

The display device may further include a demultiplexer providing data signals to the first data line and the second data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices in accordance with exemplary embodiments of the invention will be explained in detail with reference to the accompanying drawings.

Figure 1:
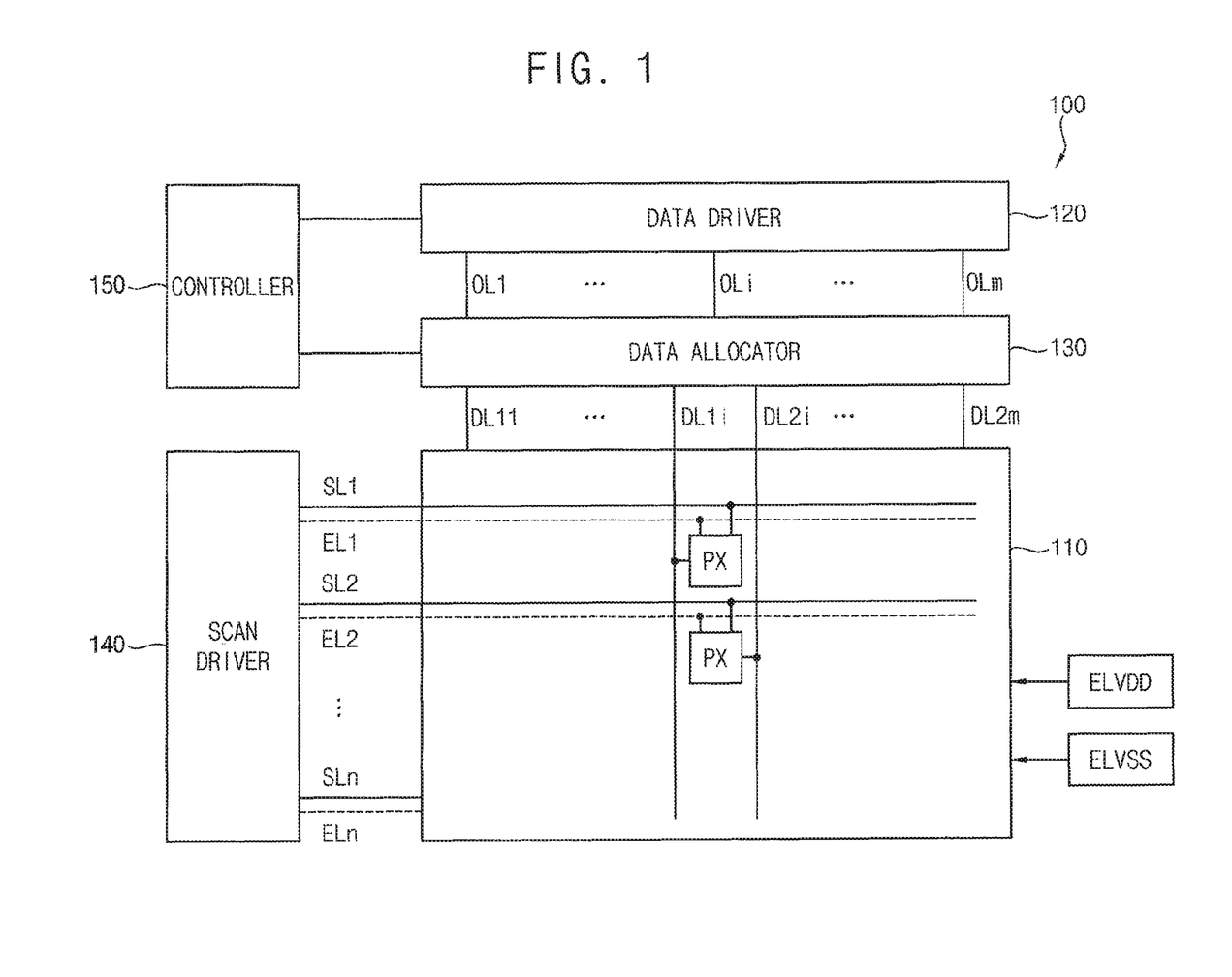
FIG. 1 is a block diagram illustrating a display device according to an exemplary embodiment of the invention.

FIG. 1 is a block diagram illustrating a display device according to an exemplary embodiment.

Referring to FIG. 1, a display device 100 according to an exemplary embodiment of the invention may include a pixel unit 110, a data driver 120, a data allocator 130, a scan driver 140, and a controller 150. The display device 100 may be an organic light emitting display device.

The pixel unit 110 may include a plurality of scan lines SL1 to SLn, a plurality of data lines DL11 to DL2$m$, a plurality of emission control lines EL1 to ELn, and a plurality of pixels PX. The scan lines SL1 to SLn may extend in a row direction and transmit scan signals. Each of the scan lines SL1 to SLn connected to a respective pixel PX may include a first scan line GIL applying a first scan signal GI, a second scan line GWL applying a second scan signal GW, and a third scan line GBL applying a third scan signal GB (refer to FIG. 2).

The data lines DL11 to DL2$m$ may extend in a column direction and transmit data signals. Two data lines DL1$i$ and DL2$i$ may be disposed for each column, and each of the two data lines DL1$i$ and DL2$i$ per column may include a first data line DL1$i$ connected to a pixel PX in an odd row and a second data line DL2$i$ connected to a pixel PX in an even row. The first and second data lines DL1$i$ and DL2$i$ may be adjacent to each other and alternately connected to the pixels PX located at an identical column. The first and second data lines DL1$i$ and DL2$i$ may be alternately arranged along a row direction.

The scan lines SL1 to SLn and the data lines DL11 to DL2$m$ may be arranged as a matrix form, and the pixels PX may be defined at their intersections. The emission control lines EL1 to ELn may transmit emission control signals. A first power voltage ELVDD and a second power voltage ELVSS may be applied to the pixels PX of the pixel unit 110. The second power voltage ELVSS may be a lower voltage than the first power voltage ELVDD.

The data driver 120 may be connected to a plurality of output lines OL1 to OLm, and the output lines OL1 to OLm may be connected to the data lines DL11 to DL2$m$ via the data allocator 130. The data driver 120 may respond to control signals from the controller 150 and transform image signals into data signals in the form of a voltage or current. The data driver 120 may apply the data signals to the output lines OL1 to OLm.

Each of the data lines DL11 to DL2$m$ may include a data capacitor. The data capacitor may temporarily store the data signals that are applied to the data lines DL11 to DL2$m$, and apply the stored data signals to the pixels PX. A parasitic capacitor, which is equivalently formed on the data lines DL11 to DL2$m$, may be used as the data capacitor. Alternatively, capacitors may be additionally formed for each of the data lines DL11 to DL2$m$ and be used as data capacitors.

The data allocator 130 may be connected to the output lines OL1 to OLm and the data lines DL11 to DL2$m$. The data allocator 130 may include m demultiplexers that include a plurality of switching elements. The number of the demultiplexers included in the data allocator 130 may be the same as the number of the output lines OL1 to OLm. An end of each of the demultiplexers may be connected to any one of the output lines OL1 to OLm. Further, another end of each of the demultiplexers may be connected to the first and second data lines DL1$i$ and DL2$i$. The demultiplexers may apply data signals from one output line to two data lines DL1$i$ and DL2$i$. By including the demultiplexers, the number of the output lines OL1 to OLm connected to the data driver 120 need not be equal to the number of data lines DL11 to DL2$m$, and thus, manufacturing cost may be reduced by connecting fewer output lines OL1 to OLm to the data driver 120 and including fewer integrated circuits in the data driver 120.

The demultiplexer may apply data signals to some data lines that are connected to that demultiplexer during a first horizontal period, and may apply data signals to data lines other than the aforementioned data lines during a second horizontal period. In this case, data lines that receive data signals during an identical horizontal period may be connected to pixels PX located at an identical row. In response to a control signal from the controller 150, during a certain horizontal period, the demultiplexer may sequentially apply data signals to the first data lines DL1$i$ connected to pixels PX in odd rows, and then, during a following horizontal period, may sequentially apply data signals to the second data lines DL2$i$ connected to pixels PX in even rows. For example, in response to a control signal from the controller 150, the demultiplexer may apply, while the second scan signal GW is being applied to the pixels PX in the odd rows, data signals to the second data lines DL2$i$ connected to the pixels PX in the even rows connected to that demultiplexer. Furthermore, the demultiplexer may apply, while the second scan signal GW is being applied to the pixels PX in the even rows, data signals to the first data lines DL1$i$ connected to the pixels in the odd rows connected to that demultiplexer. In other words, while the second scan signal GW is applied to a j-th scan line, data signals corresponding to a (j+1)-th row may be applied.

The scan driver 140 may be connected to the scan lines SL1 to SLn, and may generate scan signals in response to a control signal from the controller 150. The scan driver 140 may apply the scan signals to the scan lines SL1 to SLn. Further, the scan driver 140 may be connected to the emission control lines EL1 to ELn, and may generate emission control signals in response to a control signal from the controller 150. The scan driver 140 may apply the emission control signals to the emission control lines EL1 to ELn. According to the exemplary embodiment illustrated in FIG. 1, the scan driver 140 generates and applies the emission control signals to the pixel unit 110. However, an additional emission controller may generate and apply the emission control signals to the pixel unit 110.

The controller 150 may generate control signals in response to synchronization signals applied from an external source. The controller 150 may output a control signal for controlling the data driver 120 to the data driver 120, and may output a control signal for controlling the scan driver 140 to the scan driver 140. The controller 150 may apply the control signals to each of the demultiplexers. In this case, the controller 150 may control application of the control signals such that the data signals may be applied in row units.

Figure 2:
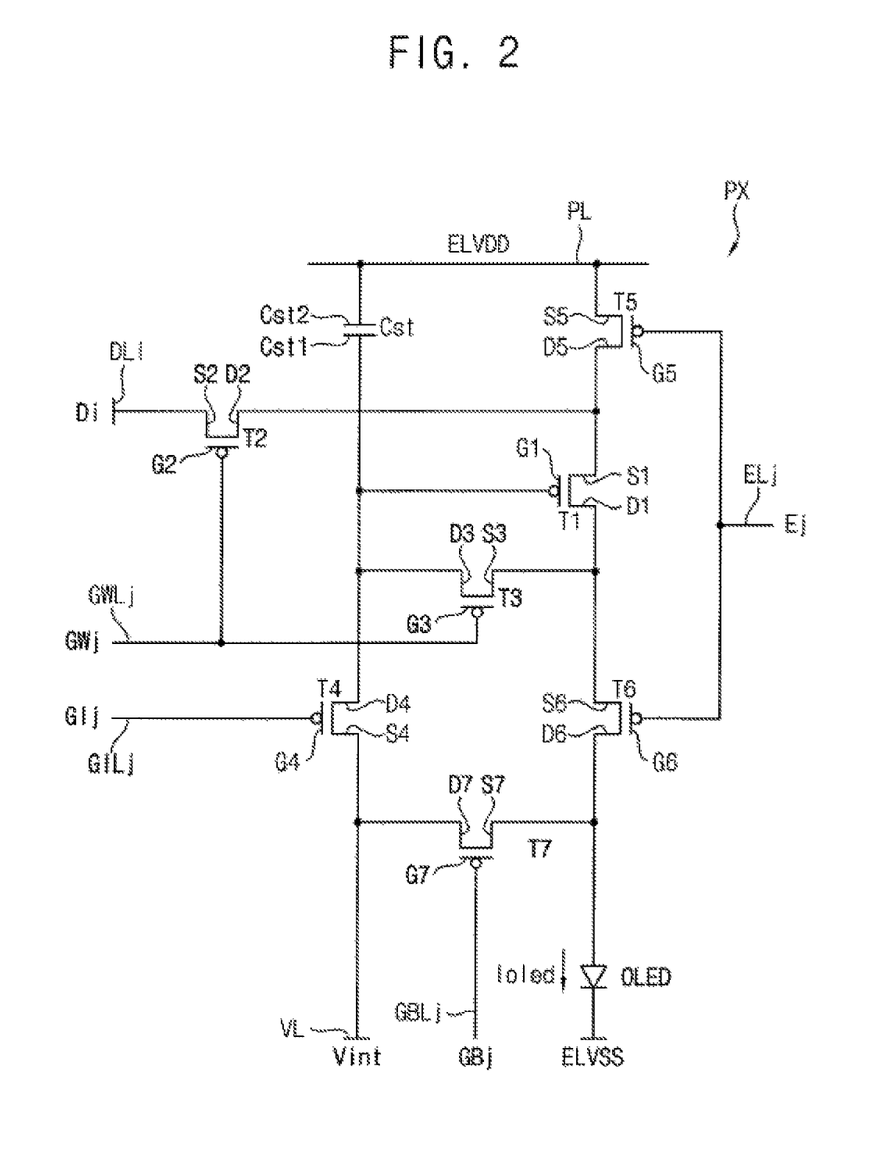
FIG. 2 is an equivalent circuit diagram illustrating a pixel of the display device in FIG. 1.

FIG. 2 is an equivalent circuit diagram illustrating a pixel PX of the display device 100 in FIG. 1.

Referring to FIG. 2, the pixel PX according to an exemplary embodiment may include a pixel circuit including first to seventh transistors T1 to T7, a capacitor Cst, and a light emitting element connected to the pixel circuit. The light emitting element may be an organic light emitting diode OLED. The organic light emitting diode OLED may include an anode, a cathode, and an emission layer between the anode and the cathode. The cathode of the organic light emitting diode OLED may be connected to a second power source that supplies the second power voltage ELVSS.

The pixel PX may be connected to a first scan line GILj transmitting the first scan signal GIj to the fourth transistor T4, a second scan line GWLj transmitting the second scan signal GWj to the second transistor T2 and the third transistor T3, an emission control line ELj transmitting an emission control signal Ej to the fifth transistor T5 and the sixth transistor T6, a data line DLi transmitting the data signal Di, a driving voltage line PL transmitting the first power voltage ELVDD, an initialization voltage line VL transmitting an initialization voltage Vint for initializing the first transistor T1, and a third scan line GBLj transmitting the third scan signal GBj to the seventh transistor T7. The data line DLi may be the first data line DL1i or the second data line DL2i illustrated in FIG. 1.

The first transistor T1 may include a gate electrode G1 connected to a first electrode Cst1 of the capacitor Cst, a first electrode S1 connected to the driving voltage line PL via the fifth transistor T5, and a second electrode D1 electrically connected to the anode of the organic light emitting diode OLED via the sixth transistor T6. The first transistor T1 may function as a driving transistor, and may receive the data signal Di according to a switching operation of the second transistor T2, and may apply current to the organic light emitting diode OLED.

The second transistor T2 may include a gate electrode G2 connected to the second scan line GWLj, a first electrode S2 connected to the data line DLi, and a second electrode D2 connected to the first electrode S1 of the first transistor T1. The second transistor T2 may function as a switching transistor, and may be turned on according to the second scan signal GWj received via the second scan line GWLj. The second transistor T2 may perform a switching operation of transmitting the data signal Di transmitted via the data line DLi to the first electrode S1 of the first transistor T1.

The third transistor T3 may include a gate electrode G3 connected to the second scan line GWLj, a first electrode S3 connected to the second electrode D1 of the first transistor T1, and a second electrode D3 connected to the first electrode Cst1 of the capacitor Cst, a second electrode D4 of the fourth transistor T4, and the gate electrode G1 of the first transistor T1. The third transistor T3 may function as a compensation transistor, and may be turned on according to the second scan signal GWj received via the second scan line GWLj. The third transistor T3 may diode-connect the first transistor T1.

The fourth transistor T4 may include a gate electrode G4 connected to the first scan line GILj, a first electrode S4 connected to the initialization voltage line VL, and the second electrode D4 connected to the first electrode Cst1 of the capacitor Cst, the second electrode D3 of the third transistor T3, and the gate electrode G1 of the first transistor T1. The fourth transistor T4 may function as an initialization transistor, and may be turned on according to the first scan signal GIj received via the first scan line GILj. The fourth transistor T4 may perform an initialization operation of initializing a gate voltage of the first transistor T1 by transmitting the initialization voltage Vint to the gate electrode G1 of the first transistor T1.

The fifth transistor T5 may include a gate electrode G5 connected to the emission control line ELj, a first electrode S5 connected to the driving voltage line PL, and a second electrode D5 connected to the first electrode S1 of the first transistor T1 and the second electrode D2 of the second transistor T2.

The sixth transistor T6 may include a gate electrode G6 connected to the emission control line ELj, a first electrode S6 connected to the second electrode D1 of the first transistor T1 and the first electrode S3 of the third transistor T3, and a second electrode D6 connected to the anode of the organic light emitting diode OLED. The fifth and sixth transistors T5 and T6 may be simultaneously or concurrently turned on according to the emission control signal Ej received via the emission control line ELj, and thus, current may flow through the organic light emitting diode OLED.

The seventh transistor T7 may include a gate electrode G7 connected to the third scan line GBLj, a first electrode S7 connected to the second electrode D6 of the sixth transistor T6 and the anode of the organic light emitting diode OLED, and a second electrode D7 connected to the initialization voltage line VL. The seventh transistor T7 may be turned on according to the third scan signal GBj received via the third scan line GBLj, and may perform an initialization operation of initializing a voltage of the anode of the organic light emitting diode OLED by transmitting the initialization voltage Vint to the anode of the organic light emitting diode OLED.

The third scan line GBLj connected to the gate electrode G7 of the seventh transistor T7 may be the first scan line GILj or the second scan line GWLj, and the third scan signal GBj may be the first scan signal GIj or the second scan signal GWj.

The capacitor Cst may include the first electrode Cst1 connected to the gate electrode G1 of the first transistor T1, the second electrode D3 of the third transistor T3, and the second electrode D4 of the fourth transistor T4, and a second electrode Cst2 connected to the driving voltage line PL.

An operation process will be briefly described below. First, the first scan signal GIj may be applied to the first scan line GILj, and thus, the fourth transistor T4 may be turned on. When the fourth transistor T4 is turned on, the initialization voltage Vint may be applied to the gate electrode G1 of the first transistor T1, and thus, a voltage of the gate electrode G1 of the first transistor T1 may be initialized as the initialization voltage Vint.

Then, the second scan signal GWj may be applied to the second scan line GWLj, and thus, the second transistor T2 and the third transistor T3 may be turned on. When the third transistor T3 is turned on, the first transistor T1 may be diode-connected. When the first transistor T1 is diode-connected, the data signal Di and a voltage corresponding to a threshold voltage of the first transistor T1 may be applied to the gate electrode G1 of the first transistor T1. When the second transistor T2 is turned on, the data signal Di may be transmitted from the data line DLi to the first electrode S1 of the first transistor T1.

Then, the third scan signal GBj may be applied to the third scan line GBLj, and thus, the seventh transistor T7 may be turned on. When the seventh transistor T7 is turned on, the anode of the organic light emitting diode OLED may be initialized as the initialization voltage Vint.

Then, the emission control signal Ej may be applied to the emission control line ELj, and thus, the fifth transistor T5 and the sixth transistor T6 may be turned on. Then, in response to the voltage applied to the gate electrode G1, the first transistor T1 may control an amount of current flowing from the first power voltage ELVDD to the second power voltage ELVSS via the organic light emitting diode OLED. In this case, the organic light emitting diode OLED may generate light with predetermined luminance level in response to the amount of current.

Figure 3:
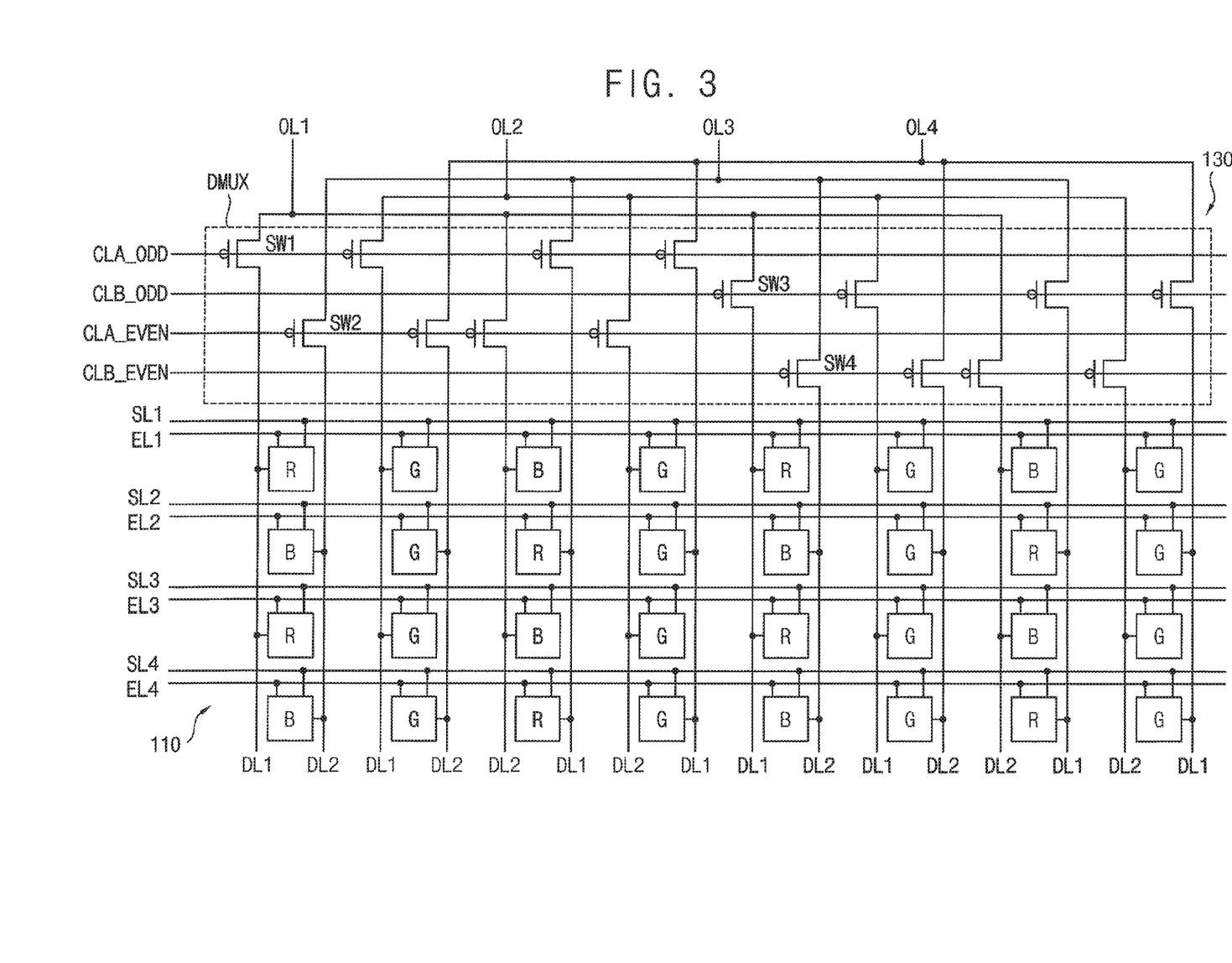
FIG. 3 is a block diagram illustrating a portion of the display device in FIG. 1.
Figure 4:
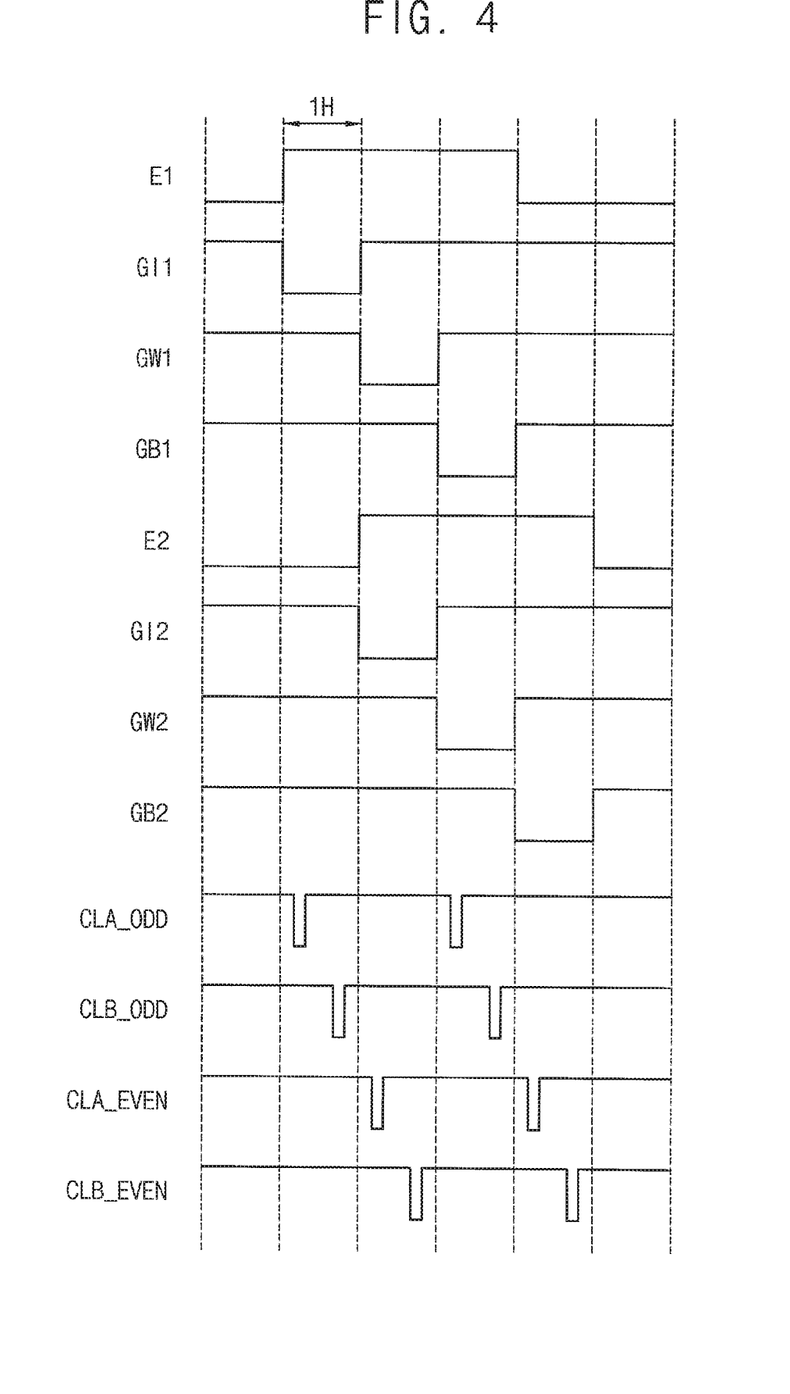
FIG. 4 is a timing diagram illustrating a method of driving the display device in FIG. 1.

FIG. 3 is a block diagram illustrating a portion of the display device 100 in FIG. 1. FIG. 4 is a timing diagram illustrating a method of driving the display device 100 in FIG. 1.

Referring to FIG. 3, the pixel unit 110 may include first pixels, second pixels, and third pixels, which emit light with different colors. The first pixels and the second pixels may be alternately arranged in an identical column, and the third pixels are arranged in a column adjacent to the column in which the first and second pixels are arranged. The first pixel may be a red pixel R emitting red light, the second pixel may be a blue pixel B emitting blue light, and the third pixel may be a green pixel G emitting green light. The red pixel R and the blue pixel B may be alternately arranged in an identical column, and the green pixel G may be arranged in a column adjacent to the column in which the red pixel R and the blue pixel B are arranged.

Two data lines, i.e., the first data line DL1 connected to the pixel PX in the odd row and the second data line DL2 connected to the pixel PX in the even row, may be substantially parallel to one another in each column. In an exemplary embodiment, light emitted by the pixel PX connected to the first data line DL1 may have a different color from light emitted by the pixel PX connected to the second data line DL2. In another exemplary embodiment, the pixel PX connected to the first data line DL1 may have a different size from the pixel PX connected to the second data line DL2.

In a first column of FIG. 3, the red pixel R may be connected to the first data line DL1, and the blue pixel B may be connected to the second data line DL2. In a third column of FIG. 3, the blue pixel B may be connected to the first data line DL1, and the red pixel R may be connected to the second data line DL2. In second and fourth columns of FIG. 3, the green pixel G may be connected to the first and second data lines DL1 and DL2.

In the exemplary embodiment of FIG. 3, an alternating order of the first and second data lines DL1 and DL2 in the first and second columns may be different from an alternating order of the first and second data lines DL1 and DL2 in the third and fourth columns. However, the inventive concepts are not limited thereto, and the alternating order of the first and second data lines DL1 and DL2 may be identical in a row direction.

The data allocator 130 may be disposed between the first to fourth output lines OL1 to OL4 and the first and second data lines DL1 and DL2 corresponding to the first to eighth columns, and may include a demultiplexer DMUX that includes first to fourth switches SW1 to SW4. The demultiplexer DMUX may be provided on every eight columns.

The first switch SW1 may be turned on by a first clock signal CLA_ODD, and may apply data signals applied to the first to fourth output lines OL1 to OL4 to each of the first data lines DL1 of the first to fourth columns. The second switch SW2 may be turned on by a second clock signal CLA_EVEN, and may apply the data signals applied to the first to fourth output lines OL1 to OL4 to each of the second data lines DL2 of the first to fourth columns. The third switch SW3 may be turned on by a third clock signal CLB_ODD, and may apply the data signals applied to the first to fourth output lines OL1 to OL4 to each of the first data lines DL1 of the fifth to eighth columns. The fourth switch SW4 may be turned on by a fourth clock signal CLB_EVEN, and may apply the data signals applied to the first to fourth output lines OL1 to OL4 to each of the second data lines DL2 of the fifth to eighth columns.

While the first scan signal GI is being applied to the pixel PX, corresponding data signals may be applied to a corresponding (i.e., connected) first data line DL1 or a corresponding (i.e., connected) second data line DL2. Afterwards, while the second scan signal GW is being applied to the pixel PX, the data signals applied to the corresponding first data line DL1 or the corresponding second data line DL2 may be applied to the pixel PX via the second transistor T2. The first scan signal GI, the second scan signal GW, and the third scan signal GB may be sequentially applied along rows in 1 horizontal period (1H) unit.

Referring to FIG. 4, while a first scan signal GI1 is being applied to the pixels PX of a first row, the first clock signal CLA_ODD and the third clock signal CLB_ODD may be applied to the data allocator 130. The first switches SW1 may be turned on by the first clock signal CLA_ODD, and the third switches SW3 may be turned on by the third clock signal CLB_ODD. Accordingly, data signals D1 of the first row may be applied to the first data lines DL1. Next, a second scan signal GW1 may be applied to the pixels PX of the first row, and the data signals D1 stored in the first data lines DL1 may be applied to the pixels PX of the first row. Similarly, while a first scan signal GI2 is being applied to the pixels PX of a second row, the second clock signal CLA_EVEN and the fourth clock signal CLB_EVEN may be applied to the data allocator 130. The second switches SW2 may be turned on by the second clock signal CLA_EVEN, and the fourth switches SW4 may be turned on by the fourth clock signal CLB_EVEN. Accordingly, data signals D2 of the second row may be applied to the second data lines DL2. Next, a second scan signal GW2 may be applied to the pixels PX in the second row, and the data signals D2 stored in the second data lines DL2 may be applied to the pixels PX of the second row. The second scan signal GW1 applied to the pixels PX of the first row mutually overlap the first scan signal GI2 applied to the pixels PX of the second row. Also, although not illustrated, the second scan signal GW2 applied to the pixels PX of the second row mutually overlap a first scan signal GI3 applied to the pixels PX of a third row. That is, a data line in the display device according to an exemplary embodiment holds a data signal for 2 horizontal periods (2H).

The inventive concepts are not limited to the aforementioned configuration of the demultiplexer DMUX and a timing diagram of a clock signal. Various exemplary embodiments of the configuration of the demultiplexer and timing of the clock signal may be provided to drive a pixel unit in which two data lines are arranged in one pixel.

Figure 5:
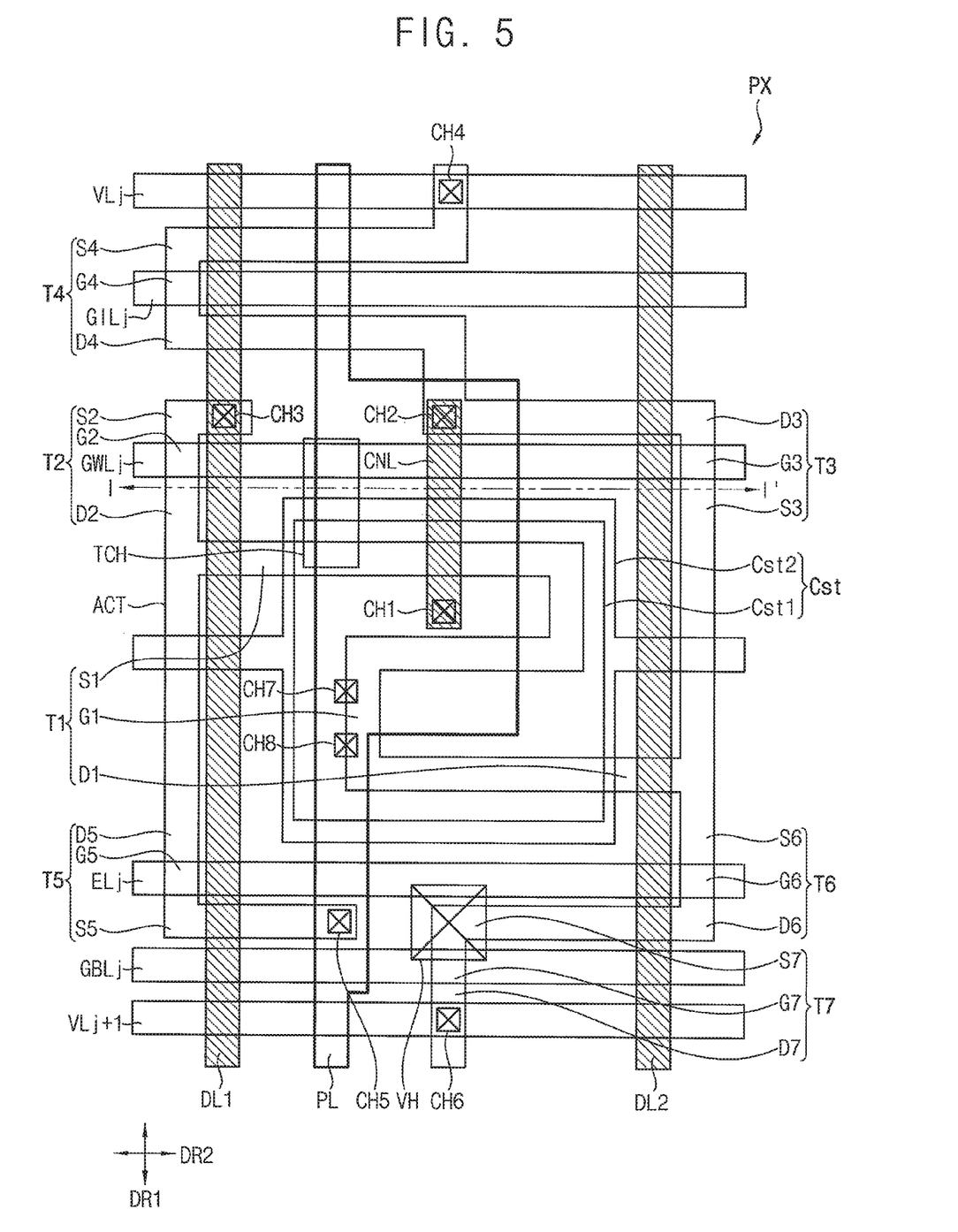
FIG. 5 is a plan view illustrating a pixel according to an exemplary embodiment of the invention.

FIG. 5 is a plan view illustrating a pixel according to an exemplary embodiment.

FIG. 5 illustrates a pixel PX in a j-th row of an arbitrary column on a substrate. The j-th row may be an odd row. FIG. 5 may be a plan view realizing the pixel PX in FIG. 2. In FIG. 5, the organic light emitting diode OLED is not illustrated, and only a pixel circuit is illustrated.

Referring to FIG. 5, the initialization voltage lines VLj and VLj+1 applying the initialization voltage Vint, the first scan line GILj applying the first scan signal GIj, the second scan line GWLj applying the second scan signal GWj, the emission control line ELj applying the emission control signal Ej, and third scan line GBLj applying the third scan signal GBj may be spaced apart from each other by a predetermined distance in a first direction DR1 and parallel to one another in a second direction DR2 crossing the first direction DR1. The first data line DL1 at a left side and the second data line DL2 at a right side may be spaced apart with a capacitor Cst in between, and parallel to one another in the first direction DR1. The driving voltage line PL may partially overlap the capacitor Cst, and may be between the first and second data lines DL1 and DL2. The driving voltage line PL may be approximately parallel to the first and second data lines DL1 and DL2 in the first direction DR1. The pixel PX in the j-th row may be connected to the first data line DL1.

According to the exemplary embodiment of FIG. 5, the first data line DL1 is at the left side, and the second data line DL2 is at the right side. However, the inventive concepts are not limited thereto, and the first data line DL1 may be at the right side, and the second data line DL2 may be at the left side.

The transistors T1 to T7 may be formed along a semiconductor layer ACT, and the semiconductor layer ACT may be curved in various ways to have different shapes. The semiconductor layer ACT may be formed by using, for example, polycrystalline silicon, amorphous silicon, etc. The semiconductor layer ACT may include a channel area that is not doped with impurities, and source and drain areas that are formed at opposite sides of the channel area by doping with impurities. The impurities may vary according to a type of the transistor. For example, the impurities may include an n-type impurity or a p-type impurity.

The first transistor T1 may include the gate electrode G1, the first electrode S1, and the second electrode D1. The first electrode S1 may correspond to a source area doped with impurities in the semiconductor layer ACT, and the second electrode D1 may correspond to a drain area doped with impurities in the semiconductor layer ACT. The gate electrode G1 may overlap a channel area. The gate electrode G1 may be electrically connected to a connecting line CNL via a first contact hole CH1, and the connecting line CNL may be electrically connected to the second electrode D3 of the third transistor T3 and the second electrode D4 of the fourth transistor T4 via the second contact hole CH2. The gate electrode G1 may function as the first electrode Cst1 of the capacitor Cst.

A semiconductor layer ACT of the first transistor T1 may be curved. By curving the semiconductor layer ACT, the semiconductor layer ACT may be elongated in a small area. Therefore, since the semiconductor layer ACT of the first transistor T1 may have a long channel area, a driving range of a gate voltage applied to the gate electrode G1 may be extended. When the driving range of the gate voltage is extended, light emitted by the organic light emitting diode OLED may be more thoroughly adjusted by changing the magnitude of the gate voltage.

The second transistor T2 may include the gate electrode G2, the first electrode S2, and the second electrode D2. The first electrode S2 may correspond to a source area doped with impurities in the semiconductor layer ACT, and the second electrode D2 may correspond to a drain area doped with impurities in the semiconductor layer ACT. The gate electrode G2 may overlap a channel area. The first electrode S2 may be electrically connected to the first data line DL1 via a third contact hole CH3. The second electrode D2 may be connected to the first electrode S1 of the first transistor T1 and the second electrode D5 of the fifth transistor T5. The gate electrode G2 may be formed from a portion of the second scan line GWLj.

The third transistor T3 may include the gate electrode G3, the first electrode S3, and the second electrode D3. The first electrode S3 may correspond to a source area doped with impurities in the semiconductor layer ACT, and the second electrode D3 may correspond to a drain area doped with impurities in the semiconductor layer ACT. The gate electrode G3 may overlap a channel area, and be formed from a portion of the second scan line GWLj.

The fourth transistor T4 may include the gate electrode G4, the first electrode S4, and the second electrode D4. The first electrode S4 may correspond to a source area doped with impurities in the semiconductor layer ACT, and the second electrode D4 may correspond to a drain area doped with impurities in the semiconductor layer ACT. The first electrode S4 may be electrically connected to the initialization voltage line VLj via a fourth contact hole CH4. The gate electrode G4 may overlap a channel area, and may be formed from a portion of the first scan line GILj. The initialization voltage line VLj may be electrically connected to a second electrode of the seventh transistor T7 on a previous row (even row) via the fourth contact hole CH4.

The fifth transistor T5 may include the gate electrode G5, the first electrode S5, and the second electrode D5. The first electrode S5 may correspond to a source area doped with impurities in the semiconductor layer ACT, and the second electrode D5 may correspond to a drain area doped with impurities in the semiconductor layer ACT. The gate electrode G5 may overlap a channel area. The first electrode S5 may be connected to the driving voltage line PL via a fifth contact hole CH5. The gate electrode G5 may be formed from a portion of the emission control line ELj.

The sixth transistor T6 may include the gate electrode G6, the first electrode S6, and the second electrode D6. The first electrode S6 may correspond to a source area doped with impurities in the semiconductor layer ACT, and the second electrode D6 may correspond to a drain area doped with impurities in the semiconductor layer ACT. The gate electrode G6 may overlap a channel area. The second electrode D6 may be electrically connected to the anode of the organic light emitting diode OLED via a via hole VH. The gate electrode G6 may be formed from a portion of the emission control line ELj.

The seventh transistor T7 may include the gate electrode G7, the first electrode S7, and the second electrode D7. The first electrode S7 may correspond to a source area doped with impurities in the semiconductor layer ACT, and the second electrode D7 may correspond to a drain area doped with impurities in the semiconductor layer ACT. The gate electrode G7 may overlap a channel area. The first electrode S7 may be connected to the second electrode D6 of the sixth transistor T6. Also, the first electrode S7 may be electrically connected to the anode of the organic light emitting diode OLED via the via hole VH. The second electrode D7 may be connected to the initialization voltage line VLj+1 in a following row (i.e., an even row), via a sixth contact hole CH6.

The connecting line CNL connected to the first contact hole CH1 may connect the first electrode Cst1 of the capacitor Cst to the second electrode D3 of the third transistor T3 and the second electrode D4 of the fourth transistor T4. The first electrode Cst1 of the capacitor Cst may also function as the gate electrode G1 of the first transistor T1. The second electrode Cst2 of the capacitor Cst may be connected to the driving voltage line PL via seventh and eighth contact holes CH7 and CH8, and may receive the first power voltage ELVDD from the driving voltage line PL.

The first electrode Cst1 of the capacitor Cst may be spaced apart from an adjacent pixel, and have a quadrilateral shape. The first electrode Cst1 of the capacitor Cst may be formed on the same level (same layer) with the same material as the first scan line GILj, the second scan line GWLj, the emission control line ELj, and the gate electrodes G1 to G7 of the first to seventh transistors T1 to T7.

The second electrode Cst2 of the capacitor Cst may be connected to the second electrodes Cst2 of pixels adjacently arranged in the second direction DR2, i.e., to the second electrodes Cst2 of the pixels in an identical row. The second electrode Cst2 of the capacitor Cst may overlap the first electrode Cst1 such that the first electrode Cst1 is completely covered, and may vertically overlap the first transistor T1. In order to create an area for the capacitor Cst which is reduced due to the curved semiconductor layer of the first transistor T1, the capacitor Cst may overlap the semiconductor layer ACT of the first transistor T1, and thus, capacitance may be generated even under a high resolution state.

The first data line DL1 may extend along the first direction DR1, and may be disposed on the left side of the pixel PX. The second data line DL2 may extend along the first direction DR1, and may be disposed on the right side of the pixel PX. The first data line DL1 may be connected to the second transistor T2 of the pixel PX in the j-th row, and the second data line DL2 may be connected to the second transistor T2 of a pixel in a (j+1)-th row located in the first direction DR1 from the pixel PX in the j-th row.

The connecting line CNL may be disposed between the first data line DL1 and the second data line DL2. The connecting line CNL may extend along the first direction DR1. The connecting line CNL may connect the first transistor T1 to the third and fourth transistors T3 and T4. Specifically, the connecting line CNL may connect the gate electrode G1 of the first transistor T1 to the second electrode D3 of the third transistor T3 and the second electrode D4 of the fourth transistor T4. The connecting line CNL may be formed on the same level (same layer) with the same material as the first data line DL1 and the second data line DL2.

The initialization voltage line VLj may extend along the second direction DR2, and may be located near the first scan line GILj. The initialization voltage line VLj may be electrically connected to the first electrode S4 of the fourth transistor T4 via the fourth contact hole CH4. The initialization voltage line VLj may be formed on the same level (same layer) with the same material as the second electrode Cst2 of the capacitor Cst.

Figure 6:
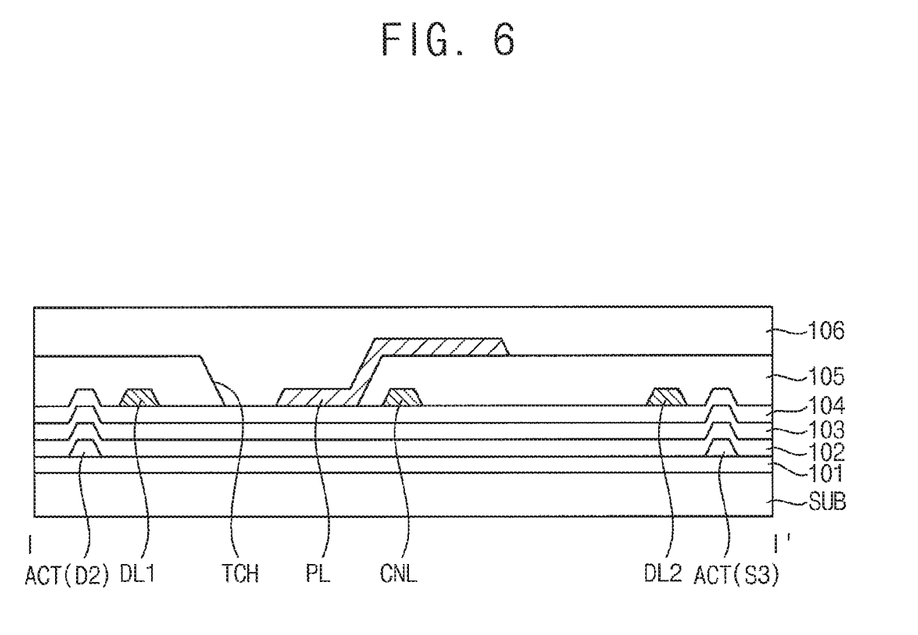
FIG. 6 is a cross-sectional view illustrating the pixel in FIG. 5 taken along a line II-II'.

FIG. 6 is a cross-sectional view illustrating the pixel in FIG. 5 taken along a line I-I'.

Referring to FIGS. 5 and 6, a buffer layer 101 may be disposed on a substrate SUB, and the semiconductor layer ACT of each of the first to seventh transistors T1 to T7 may be disposed on the buffer layer 101. FIG. 6 illustrates the second electrode D2 of the second transistor T2 and the first electrode S3 of the third transistor T3.

A first insulation layer 102 may be disposed on the semiconductor layer ACT. The first insulation layer 102 may function as a gate insulation layer. The first insulation layer 102 may be formed as a single inorganic insulation layer or a plurality of inorganic insulation layers. The signal lines including, i.e., the first scan line GILj, the second scan line GWLj, the third scan line GBLj, and the emission control lines ELj, the gate electrodes G1 to G7 of the first to seventh transistors T1 to T7, and the first electrode Cst1 of the capacitor Cst, may be disposed on the first insulation layer 102.

A second insulation layer 103 may be disposed on the signal lines, the gate electrodes G1 to G7, and the first electrode Cst1. The second insulation layer 103 may be formed as a single inorganic insulating layer or a plurality of inorganic insulating layers. The initialization voltage lines VLj and VLj+1 and the second electrode Cst2 of the capacitor Cst may be disposed on the second insulation layer 103.

A third insulation layer 104 may be disposed on the initialization voltage lines VLj and VLj+1 and the second electrode Cst2. The third insulation layer 104 may be formed as a single inorganic insulation layer or a plurality of inorganic insulation layers. The first data line DL1, the second data line DL2, and the connecting line CNL may be disposed on the third insulation layer 104.

A fourth insulation layer 105 may be disposed on the first data line DL1, the second data line DL2, and the connecting line CNL. The fourth insulation layer 105 may be formed as a single organic insulation layer or a plurality of organic insulation layers. The driving voltage line PL may be disposed on the fourth insulation layer 105. The driving voltage line PL may extend toward between the first data line DL1 and the connecting line CNL, and may shield the first data line DL1 and the connecting line CNL from each other. Accordingly, the driving voltage line PL may prevent crosstalk between the first data line DL1 and the connecting line CNL.

A trench TCH may be defined in the fourth insulation layer 105 between the first data line DL1 and the connecting line CNL. The trench TCH may expose a portion of an upper surface of the third insulation layer 104. In an exemplary embodiment, the trench TCH may have a polygonal shape in a plan view as illustrated in FIG. 5. For example, the trench TCH may have a planar shape such as quadrangle, etc. surrounded by a sidewall of the fourth insulation layer 105 in a plan view.

The driving voltage line PL may extend into the trench TCH. For example, the driving voltage line PL disposed on the fourth insulation layer 105 may extend into the trench TCH along a sidewall of the trench TCH and the upper surface of the third insulation layer 104. Accordingly, a portion of the driving voltage line PL may be located between the first data line DL1 and the connecting line CNL, and the driving voltage line PL may shield the first data line DL1 and the connecting line CNL from each other.

In the exemplary embodiment of FIGS. 5 and 6, the trench TCH is defined in the fourth insulation layer 105 between the first data line DL1 and the connecting line CNL, and the driving voltage line PL extends between the first data line DL1 and the connecting line CNL. However, the inventive concepts are not limited thereto, a trench TCH may be defined in the fourth insulation layer 105 between the second data line DL2 and the connecting line CNL, and the driving voltage line PL may extend between the second data line DL2 and the connecting line CNL. In this case, the driving voltage line PL may shield the second data line DL2 and the connecting line CNL from each other.

A fifth insulation layer 106 may be disposed on the driving voltage line PL. The fifth insulation layer 106 may be formed as a single organic insulation layer or a plurality of organic insulation layers. An organic light emitting diode may be disposed on the fifth insulation layer 106.

Figure 7:
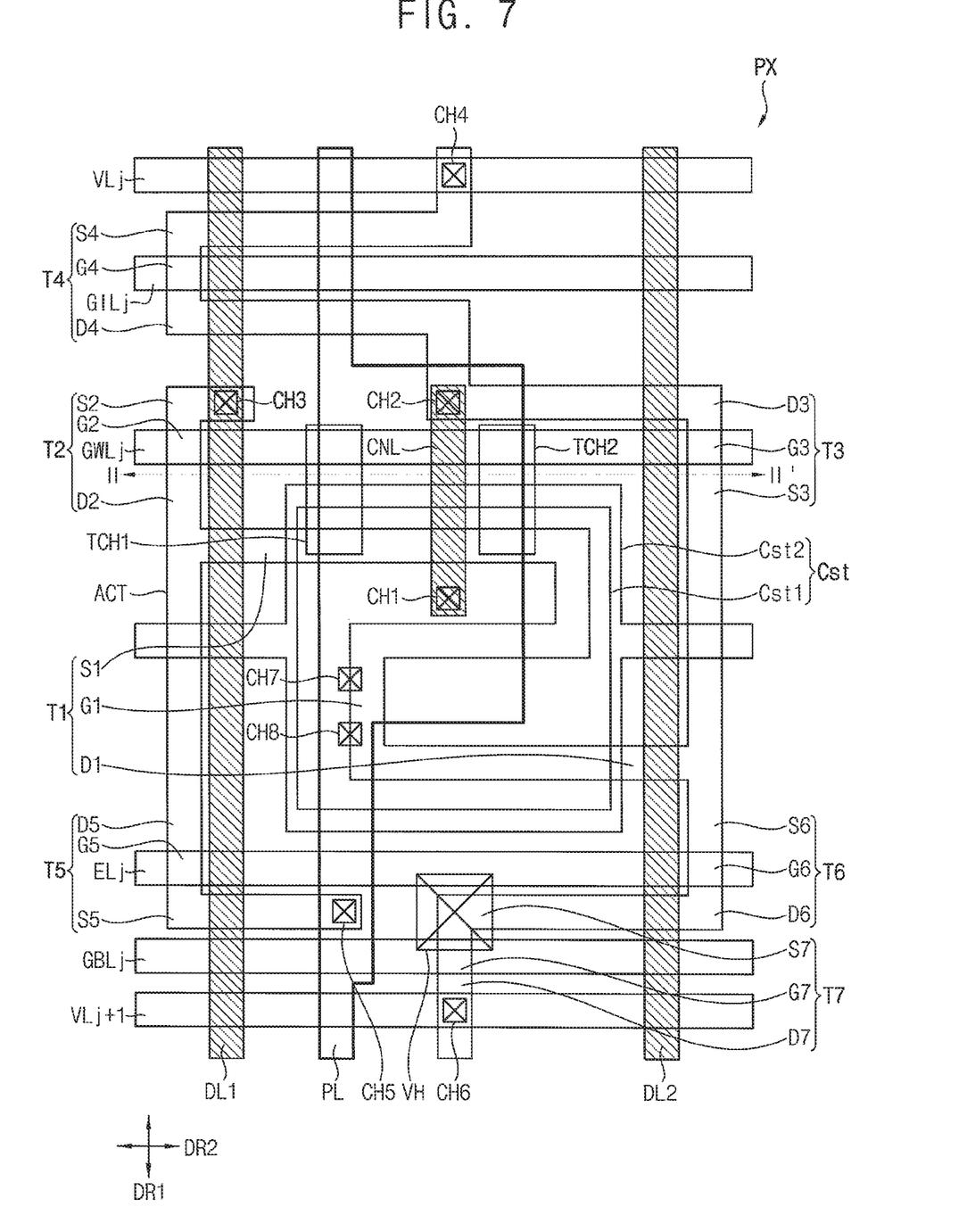
FIG. 7 is a plan view illustrating a pixel according to an exemplary embodiment of the invention.
Figure 8:
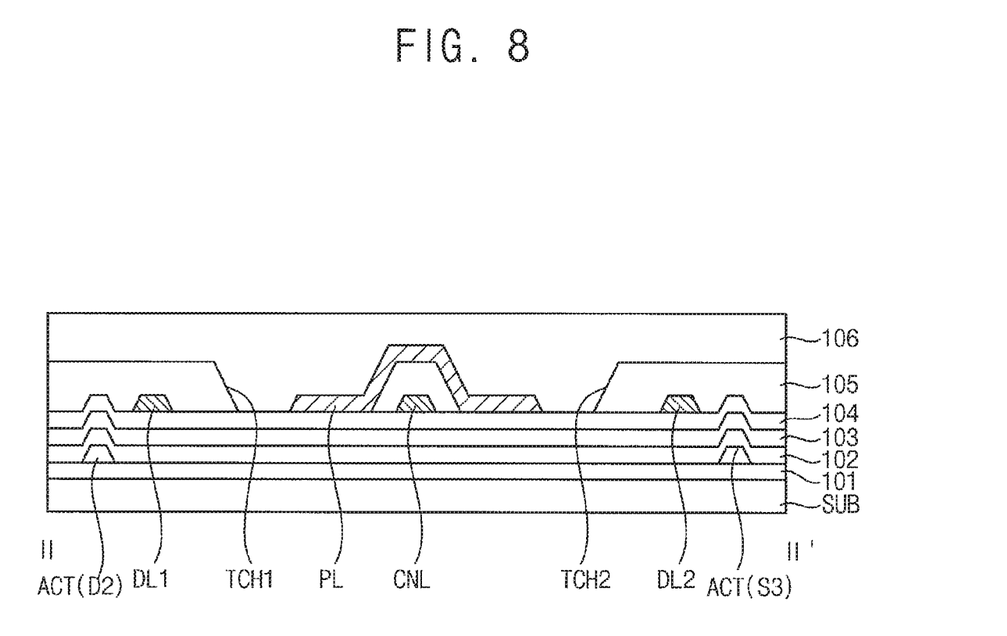
FIG. 8 is a cross-sectional view illustrating the pixel in FIG. 7 taken along a line II-II'.

FIG. 7 is a plan view illustrating a pixel according to another exemplary embodiment. FIG. 8 is a cross-sectional view illustrating the pixel in FIG. 7 taken along a line II-II'.

Elements of the pixel PX according to the exemplary embodiment with reference with FIGS. 7 and 8, which are substantially the same as or similar to the elements of the pixel PX according to the exemplary embodiment with reference with FIGS. 5 and 6, may be omitted in the detailed description below.

Referring to FIGS. 7 and 8, a fourth insulation layer 105 may be disposed on the first data line DL1, the second data line DL2, and the connecting line CNL. The fourth insulation layer 105 may be formed as a single organic insulation layer or a plurality of organic insulation layers. The driving voltage line PL may be disposed on the fourth insulation layer 105. The driving voltage line PL may extend toward between the first data line DL1 and the connecting line CNL and toward between the second data line DL2 and the connecting line CNL, and may shield the first data line DL1, the connecting line CNL and the second data line DL2 from each other. Accordingly, the driving voltage line PL may prevent crosstalk between the first data line DL1 and the connecting line CNL and crosstalk between the second data line DL2 and the connecting line CNL.

A first trench TCH1 may be defined in the fourth insulation layer 150 between the first data line DL1 and the connecting line CNL, and a second trench TCH2 may be defined in the fourth insulation layer 150 between the second data line DL2 and the connecting line CNL. Each of the first and second trenches TCH1 and TCH2 may expose a portion of an upper surface of the third insulation layer 104. In an exemplary embodiment, the first and second trenches TCH1 and TCH2 may have a polygonal shape in a plan view, as illustrated in FIG. 7. For example, the first and second trenches TCH1 and TCH2 may have a planar shape, such as quadrangle, etc. surrounded by a sidewall of the fourth insulation layer 105 in a plan view.

The driving voltage line PL may extend into the first and second trenches TCH1 and TCH2. For example, the driving voltage line PL disposed on the fourth insulation layer 105 may extend into the first trench TCH1 along a sidewall of the first trench TCH1 and the upper surface of the third insulation layer 104, and may extend into the second trench TCH2 along a sidewall of the second trench TCH2 and the upper surface of the third insulation layer 104. Accordingly, a portion of the driving voltage line PL may be located between the first data line DL1 and the connecting line CNL, and another portion of the driving voltage line PL may be located between the second data line DL2 and the connecting line CNL. Thus, the driving voltage line PL may shield the first data line DL1, the connecting line CNL, and the second data line DL2 from each other.

The display device according to the inventive concepts may be applied to a display device included in a computer, a notebook, a mobile phone, a smartphone, a smart pad, a PMP, a PDA, an MP3 player, or the like.

The display device according to the inventive concepts may include the driving voltage line extending between the first data line and the connecting line and/or between the second data line and the connecting line. Thus, a crosstalk between the first data line and the connecting line and/or between the second data line and the connecting line may be minimized.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first data line and a second data line disposed on a first insulation layer and extending along a first direction;
   a first transistor connected to the first data line;
   a second transistor connected to the first transistor;
   a third transistor electrically connected to the second transistor;
   a connecting line disposed on the first insulation layer between the first data line and the second data line, the connecting line connecting the second transistor to the third transistor;
   a driving voltage line disposed on the connecting line, the driving voltage line extending between the first data line and the connecting line; and
   a second insulation layer disposed on the first insulation layer between the connecting line and the driving voltage line, a first trench being defined in the second insulation layer between the first data line and the connecting line and exposing an upper surface of the first insulation layer,
   wherein the driving voltage line extends into the first trench and contacts the exposed upper surface of the first insulation layer.

2. The display device of claim 1, wherein the first trench has a polygonal shape in a plan view.

3. The display device of claim 1, wherein the driving voltage line extends between the second data line and the connecting line.

4. The display device of claim 3, further comprising a second trench being defined in the second insulation layer between the second data line and the connecting line and exposing an upper surface of the first insulation layer,
   wherein the driving voltage line extends into the second trench and contacts the exposed upper surface of the first insulation layer in the second trench-.

5. The display device of claim 1, wherein the first data line, the second data line, and the connecting line are disposed at the same layer.

6. The display device of claim 1, wherein the connecting line connects a gate electrode of the second transistor to a source/drain region of the third transistor.

7. The display device of claim 1, wherein the connecting line extends along the first direction.

8. The display device of claim 1, further comprising an organic light emitting element electrically connected to the second transistor.

9. The display device of claim 1, further comprising:
a capacitor comprising a first electrode and a second electrode,
wherein:
the first electrode of the capacitor is connected to the connecting line; and
the second electrode of the capacitor is connected to the driving voltage line.

10. The display device of claim 1, wherein the third transistor electrically connects a gate electrode to a source/drain region of the second transistor.

11. The display device of claim 1, further comprising an initialization voltage line extending along a second direction crossing the first direction,
wherein the third transistor is connected to the initialization voltage line.

12. A display device comprising:
a first pixel comprising a plurality of transistors;
a second pixel located in a first direction from the first pixel;
a first data line disposed on a first insulation layer extending along the first direction and connected to the first pixel;
a second data line disposed on the first insulation layer extending along the first direction and connected to the second pixel;
a connecting line disposed on the first insulation layer between the first data line and the second data line, the connecting line connecting two transistors among the plurality of transistors;
a driving voltage line disposed on the connecting line, the driving voltage line extending between the first data line and the connecting line; and
a second insulation layer disposed on the first insulation layer between the connecting line and the driving voltage line, a first trench being defined in the second insulation layer between the first data line and the connecting line and exposing an upper surface of the first insulation layer,
wherein the driving voltage line extends into the first trench and contacts the exposed upper surface of the first insulation layer.

13. The display device of claim 12, wherein the first trench has a polygonal shape in a plan view.

14. The display device of claim 12, wherein the driving voltage line extends between the second data line and the connecting line.

15. The display device of claim 14, further comprising a second trench being defined in the second insulation layer between the second data line and the connecting line and exposing an upper surface of the first insulation layer,
wherein the driving voltage line extends into the second trench and contacts the exposed upper surface of the first insulation layer in the second trench.

16. The display device of claim 12, wherein the first data line, the second data line, and the connecting line are disposed at the same layer.

17. The display device of claim 12, wherein the plurality of transistors comprises:
a first transistor connected to the first data line;
a second transistor connected to the first transistor; and
a third transistor electrically connected to the second transistor,
wherein the connecting line connects a gate electrode of the second transistor to a source/drain region of the third transistor.

18. The display device of claim 12, further comprising a demultiplexer configured to provide data signals to the first data line and the second data line.

* * * * *